US011340310B2

(12) United States Patent
Hotta et al.

(10) Patent No.: US 11,340,310 B2
(45) Date of Patent: May 24, 2022

(54) VOLTAGE IMBALANCE ASSESSMENT METHOD AND POWER CONVERSION DEVICE

(71) Applicant: Hitachi Industrial Equipment Systems Co., Ltd., Tokyo (JP)

(72) Inventors: Kazushige Hotta, Tokyo (JP); Keisuke Tanabe, Tokyo (JP); Yusuke Arao, Tokyo (JP)

(73) Assignee: Hitachi Industrial Equipment Systems Co., Ltd., Tokyo (JP)

( * ) Notice: Subject to any disclaimer, the term of this patent is extended or adjusted under 35 U.S.C. 154(b) by 19 days.

(21) Appl. No.: 16/956,830

(22) PCT Filed: Jan. 12, 2018

(86) PCT No.: PCT/JP2018/000716
§ 371 (c)(1),
(2) Date: Jun. 22, 2020

(87) PCT Pub. No.: WO2019/138554
PCT Pub. Date: Jul. 18, 2019

(65) Prior Publication Data
US 2020/0400754 A1 Dec. 24, 2020

(51) Int. Cl.
*H02M 1/14* (2006.01)
*G01R 31/42* (2006.01)
(Continued)

(52) U.S. Cl.
CPC ............ *G01R 31/42* (2013.01); *H02M 1/088* (2013.01); *H02M 1/143* (2013.01); *H02M 5/458* (2013.01)

(58) Field of Classification Search
CPC .......... H02M 1/14; H02M 1/143; H02M 1/15; H02M 5/458; G01R 31/42
See application file for complete search history.

(56) References Cited

U.S. PATENT DOCUMENTS 4,423,374 A 12/1983 Hansen, Jr.
5,034,876 A * 7/1991 Kirchberg, Jr ........ H02M 7/529
363/97

(Continued)

FOREIGN PATENT DOCUMENTS

JP 10-62470 A 3/1998
JP 11-206003 A 7/1999
JP 2012-231672 A 11/2012

OTHER PUBLICATIONS

Extended European Search Report issued in European Application No. 18900170.4 dated Jul. 9, 2021 (nine (9) pages).
(Continued)

*Primary Examiner* — Harry R Behm
(74) *Attorney, Agent, or Firm* — Crowell & Moring LLP

(57) ABSTRACT

This voltage imbalance assessment method is for a power conversion device comprising a forward converter for rectifying the voltage of a three-phase AC power supply, a smoothing capacitor for smoothing the rectified voltage, a detection unit for detecting the smoothed voltage, and a control unit. The control unit: uses the detected voltage to generate data indicating frequency components; compares, in the data indicating frequency components, the magnitude of the component that is four times the power supply frequency with the magnitude of the component that is six times the power supply frequency; and assesses the voltage imbalance of the three-phase AC power supply on the basis of the comparison.

11 Claims, 6 Drawing Sheets

(51) Int. Cl.
*H02M 1/088* (2006.01)
*H02M 5/458* (2006.01)

(56) References Cited

U.S. PATENT DOCUMENTS

| | | | |
|---|---|---|---|
| 2013/0033914 A1* | 2/2013 | Yahata | H02M 7/48 |
| | | | 363/132 |
| 2013/0155729 A1 | 6/2013 | Lee | |
| 2013/0286692 A1 | 10/2013 | Patel et al. | |
| 2014/0254217 A1* | 9/2014 | Li | H02H 7/1255 |
| | | | 363/37 |
| 2016/0380575 A1 | 12/2016 | Tsumura et al. | |

OTHER PUBLICATIONS

International Search Report (PCT/ISA/210) issued in PCT Application No. PCT/JP2018/000716 dated Apr. 3, 2018 with English translation (two (2) pages).

Japanese-language Written Opinion (PCT/ISA/237) issued in PCT Application No. PCT/JP2018/000716 dated Apr. 3, 2018 (three (3) pages).

* cited by examiner

F I G. 1
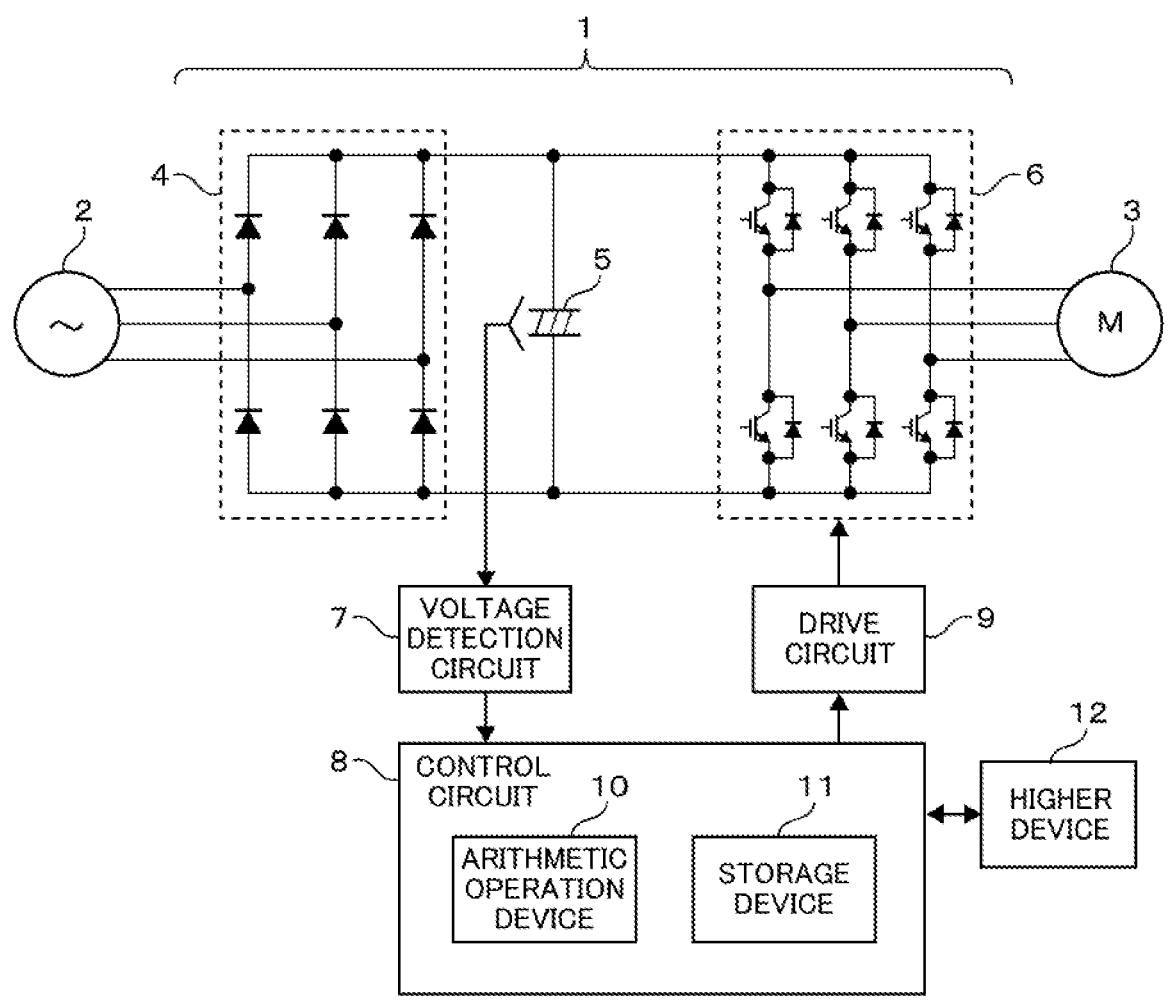

F I G. 3
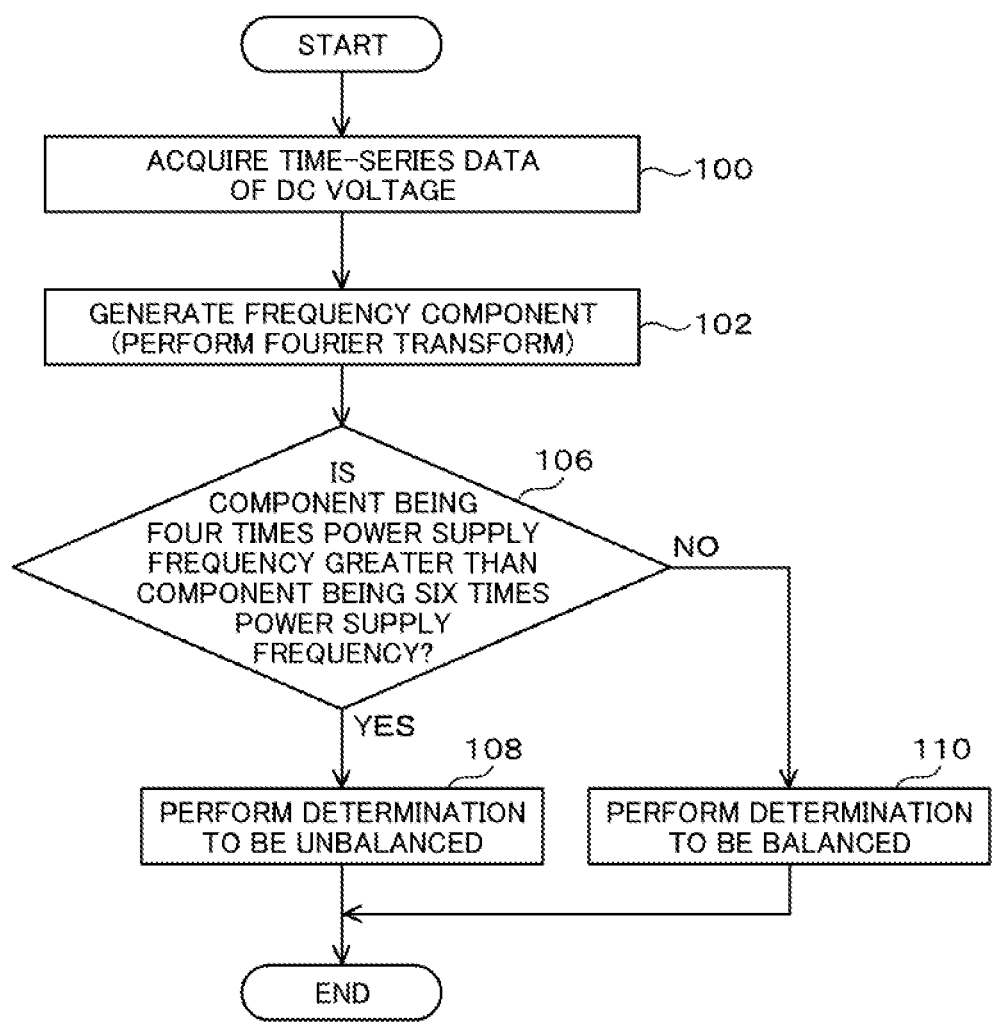

F I G. 4
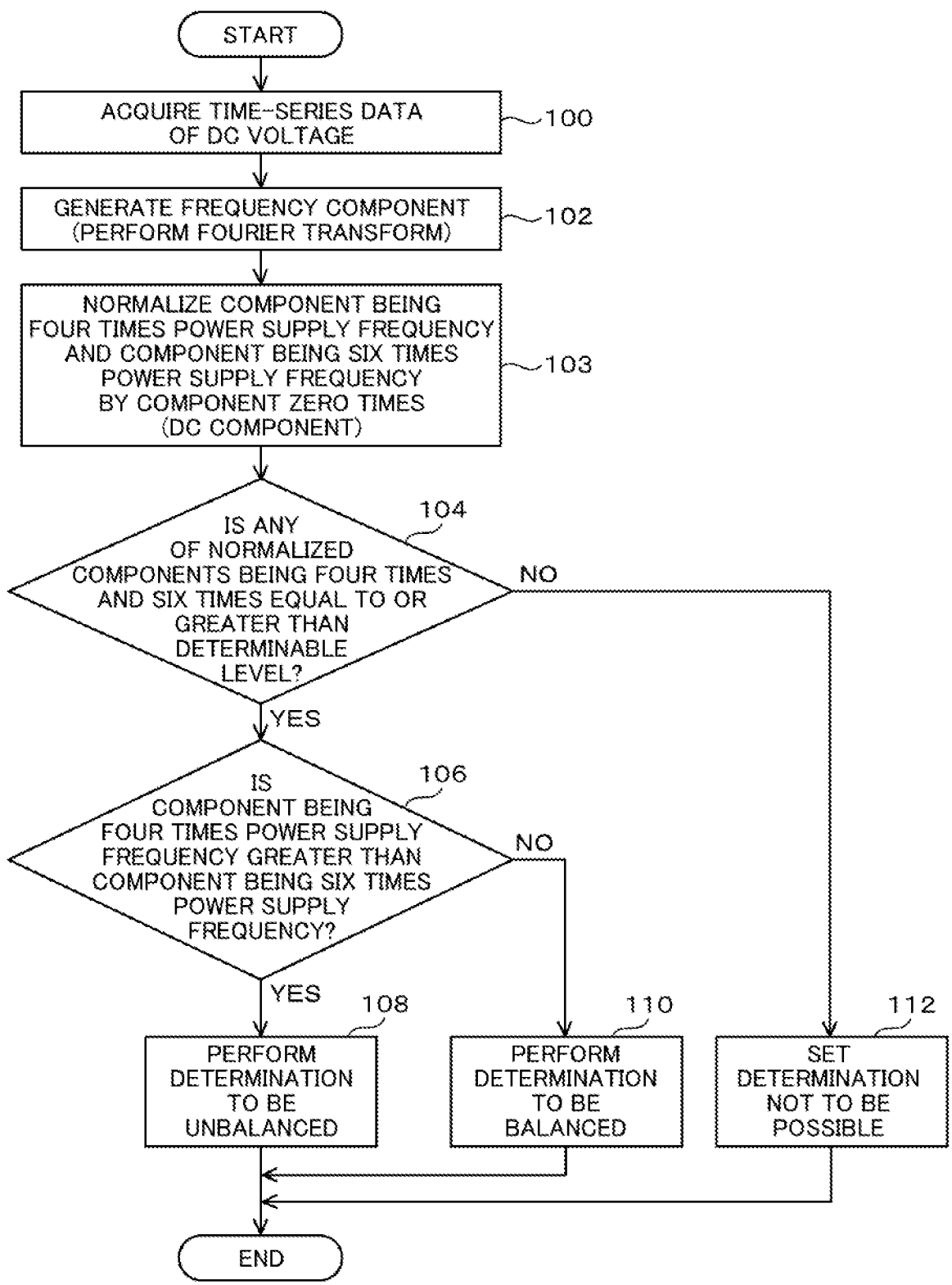

F I G. 5
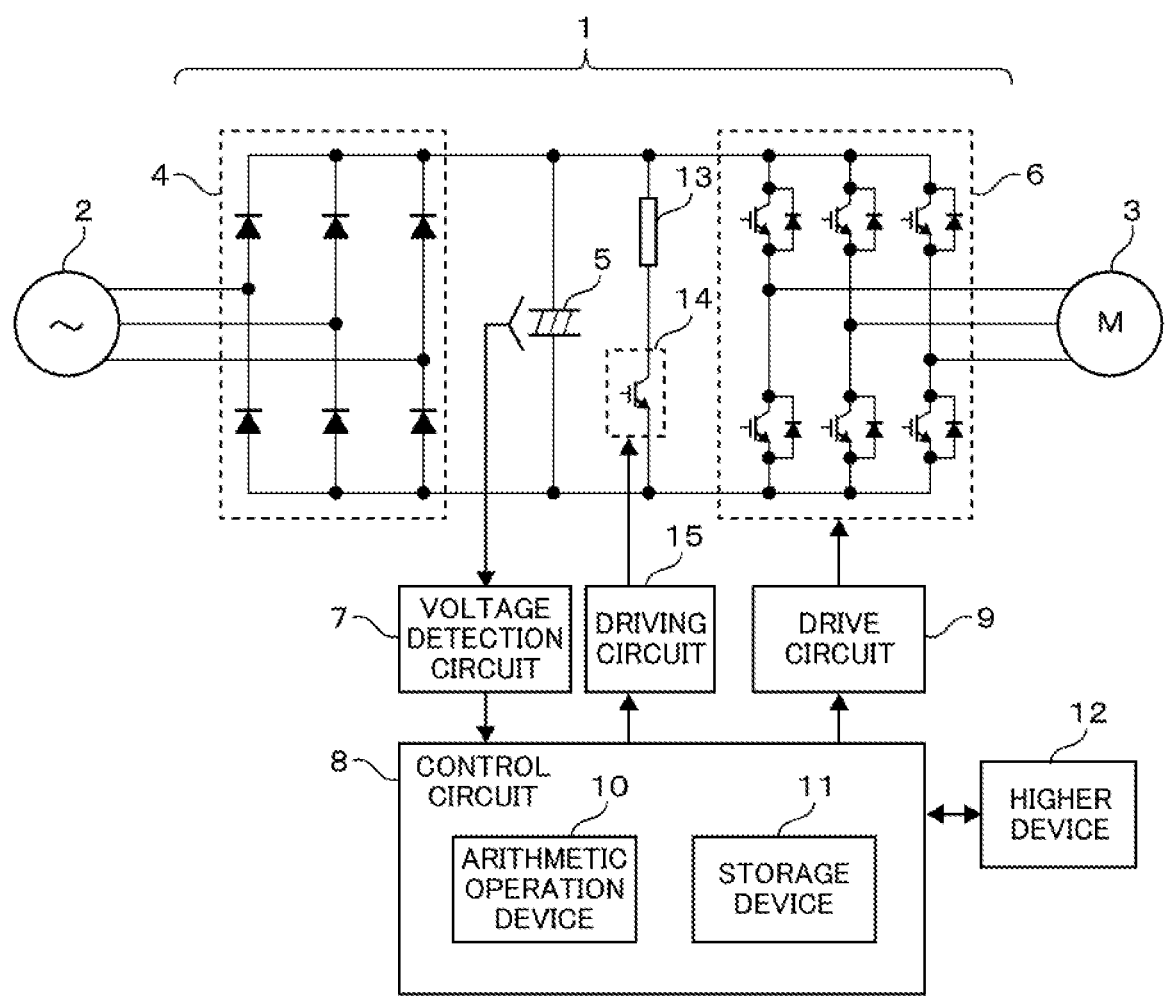

VOLTAGE IMBALANCE ASSESSMENT METHOD AND POWER CONVERSION DEVICE

TECHNICAL FIELD

The present invention relates to a technology of assessing the imbalance of an AC power supply, and particularly, to a technology of assessing the imbalance of an AC power supply with a power conversion device that rectifies and smooths a three-phase AC voltage.

BACKGROUND ART

In commercial power sources, it is rare that voltages of three phases are accurately balanced, due to the influence of an environment of a power source facility, a change in power use situation, and the like, and thus the magnitude of the imbalance also changes sequentially in many cases. As an influence of extreme voltage imbalance on connected devices, an example as follows is known. That is, in a power conversion device such as a general-purpose inverter, that includes a rectifier circuit (forward converter) and a smoothing capacitor, an excessive current flows into a part of the rectifier circuit, and this leads to damage the rectifier circuit or to accelerate degradation of the smoothing capacitor.

From such a background, it is important to detect an unbalanced state of an input power supply in order to secure electrical safety such as protection of a device. The detection of the unbalanced state is also required in terms of monitoring the quality of electricity as measures for rational electricity use.

As a typical example of imbalance, there is an input phase loss condition in which any one in a three-phase input is lost. Patent Document 1 discloses a technology of performing a FFT operation on a DC voltage after rectification and smoothing and detecting the input phase loss from the level change between a component being two times the obtained power supply frequency and a component being six times the power supply frequency, in a power conversion device including a rectifier circuit and a smoothing capacitor.

CITATION LIST

Patent Document

Patent Document 1: JP 10-62470 A

SUMMARY OF THE INVENTION

Problems to be Solved by the Invention

In the technology disclosed in Patent Document 1, only the occurrence of the input phase loss in which any one in a three-phase input is lost is assessed. Thus, whether a three-phase voltage is in an unbalanced state is not considered. As described above, even if the phase loss does not occur, the device may be damaged depending on the degree of voltage imbalance. In the related art as in Patent Document 1, there is a possibility that it is not possible to correctly detect such a voltage unbalanced state that does not lead to phase loss.

An object of the present invention is to provide a method of assessing whether or not phase voltages of a three-phase input power supply are unbalanced, and a power conversion device using the method.

Solutions to Problems

One preferred example of the present invention is a voltage imbalance assessment method in a power conversion device including a forward converter that rectifies a voltage of a three-phase AC power supply, a smoothing capacitor that smooths the rectified voltage, a detection unit that detects the smoothed voltage, and a control unit. The control unit generates data indicating frequency components, based on the detected voltage, compares the magnitude of a component being four times the power supply frequency with the magnitude of a component being six times the power supply frequency in the data indicating the frequency components, and assesses voltage imbalance of the three-phase AC power supply based on the comparison.

Another preferred example of the present invention is a power conversion device including a forward converter that rectifies a voltage from a three-phase AC power supply, a smoothing capacitor that smooths the rectified voltage, a voltage detection unit that detects a voltage of the smoothing capacitor, and an arithmetic operation unit that is connected to the voltage detection unit. The arithmetic operation unit acquires time-series data of the voltage detected by the voltage detection unit, generates data indicating frequency components based on the acquired time-series data, compares a magnitude of a component being four times a power supply frequency with a magnitude of a component being six times the power supply frequency in the data indicating the frequency components, and assesses voltage imbalance of the three-phase AC power supply based on the comparison.

Effects of the Invention

According to the present invention, it is possible to assess whether or not phase voltages of a three-phase input power supply are unbalanced.

BRIEF DESCRIPTION OF THE DRAWINGS

FIG. 1 is a schematic block diagram illustrating a configuration of a power conversion device in Example 1.

FIG. 3 is a diagram illustrating a flowchart illustrating an example of voltage imbalance assessment in Example 1.

FIG. 4 is a diagram illustrating a flowchart illustrating another example of the voltage imbalance assessment in Example 1.

FIG. 5 is a schematic block diagram illustrating a configuration of a power conversion device in Example 2.

MODE FOR CARRYING OUT THE INVENTION

Figure 2A:
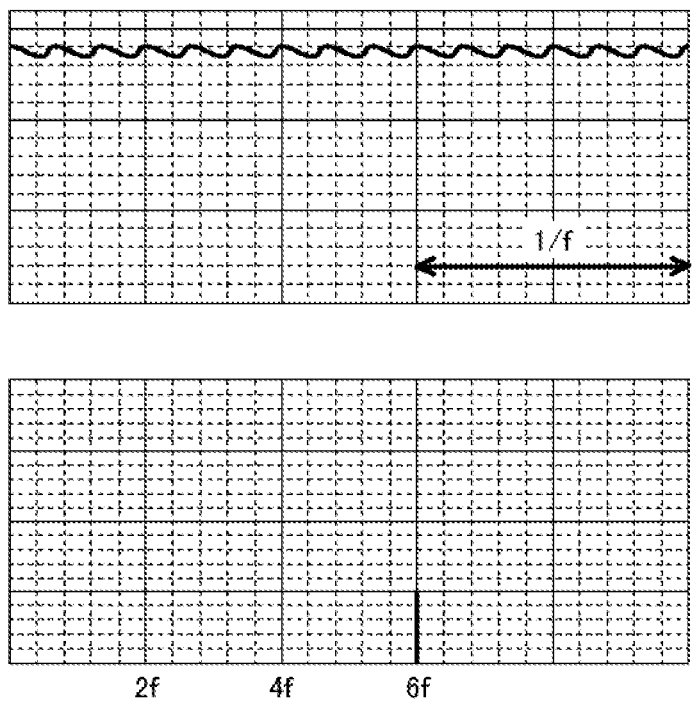
FIGS. 2A and 2B are graphs showing simulation results of a voltage waveform and a Fourier spectrum in each of balanced and unbalanced states of a three-phase input voltage.

Hereinafter, examples will be described in detail with reference to the drawings.

Example 1

FIG. 1 illustrates a block diagram of a power conversion device 1 in Example 1. A power conversion device 1 converts predetermined frequency power from a three-phase AC power supply 2 into three-phase AC power having a variable frequency, and supplies the power to a load device 3 (including an induction motor and a synchronous motor which are so-called motors). The power conversion device 1 includes a forward converter 4 (converter, also referred to as a rectifier circuit), a smoothing capacitor 5, and a backward converter 6 (inverter). The forward converter 4 is configured by a plurality of diodes (six in FIG. 1) and converts AC power of the three-phase AC power supply 2 into DC power.

The smoothing capacitor 5 is provided in a DC intermediate circuit between the forward converter 4 and the backward converter 6 and smooths a DC voltage after rectification of the forward converter 4. The backward converter 6 is configured by switching elements, for example, elements such as IGBTs. Two switching elements are disposed to each of a plurality of phases (six in total by three phases in Example 1). Further, a drive circuit 9 that drives the switching elements constituting the backward converter 6 is provided in the power conversion device 1 in order to supply power to the load device 3. The backward converter 6 has a function of converting the smoothed voltage into AC voltages having different frequencies.

A control circuit 8 (may also be referred to as a control unit) controls the entirety of the power conversion device 1. The control circuit 8 is configured by an arithmetic operation device 10 (may also be referred to as an arithmetic operation unit) such as a micro-computer, a storage device 11, and the like, for example. The control circuit 8 is connected to the drive circuit 9, and controls the switching element of the backward converter 6 through the arithmetic operation device 10 and the drive circuit 9, based on a command (for example, a voltage and a frequency) which is received from the outside and relates to an output to the load device 3.

A voltage detection circuit 7 that detects a DC voltage between both ends of the smoothing capacitor 5 is connected to the control circuit 8. The arithmetic operation device 10 takes the voltage detected by the voltage detection circuit 7, as a voltage detection value, through an A/D converter constituting the control circuit 8, for example. The detection value taken into the arithmetic operation device 10 is, for example, used for an internal arithmetic operation or is stored in the storage device 11 as a record when a problem occurs.

A higher device 12 (for example, an operation panel) is disposed outside the power conversion device 1 and is connected to the power conversion device 1. The higher device 12 transmits settings or commands of various types of control data to the power conversion device 1, so as to control an operation of the power conversion device 1. The higher device 12 receives internal information (for example, an operation or stopped state, or a detection value of the DC voltage or the like) from the power conversion device 1. The received data is, for example, stored as time-series data on an operation status and is used for monitoring the power conversion device 1, for example, analyzing the operation status or the sign of abnormality. Incidentally, the higher device 12 is not limited to the operation panel, and may be a programmable logic controller via a network or a communication device, for example.

Incidentally, in Example 1, the backward converter 6 and the load device 3 are set to have a three-phase output, but are not limited to the three-phase output. For example, an induction motor having a single-phase output, or a load device 3 (such as a resistive load) other than an induction motor may be provided. Any device that consumes power can be applied as the load device.

Figure 2B:
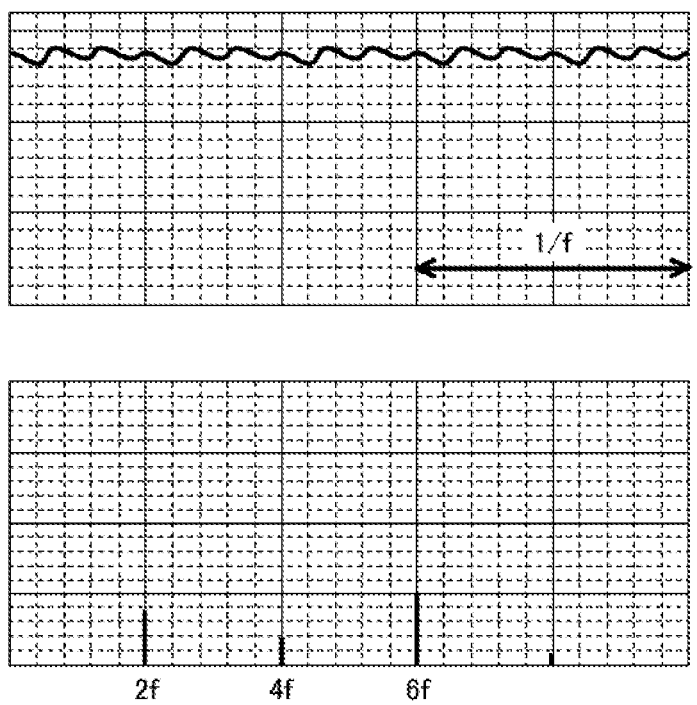
Figure 2C:
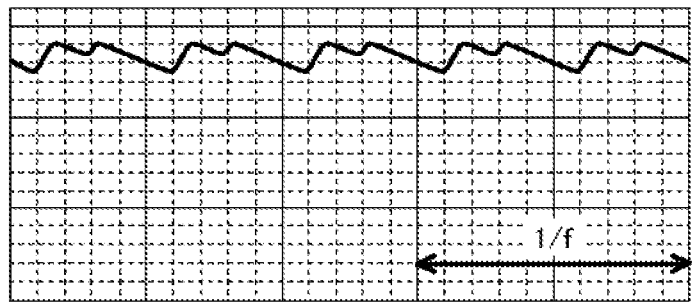
FIGS. 2C and 2D are graphs showing simulation results of the voltage waveform and the Fourier spectrum in each of the unbalanced state and a phase loss state of the three-phase input voltage.
Figure 2C:
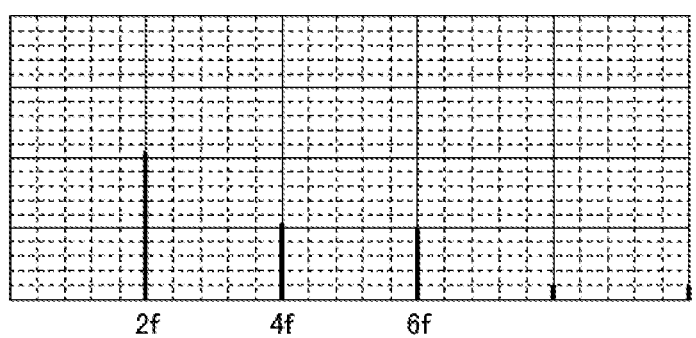
Figure 2D:
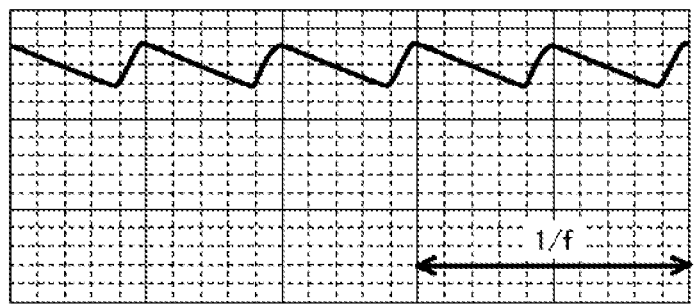
Figure 2D:
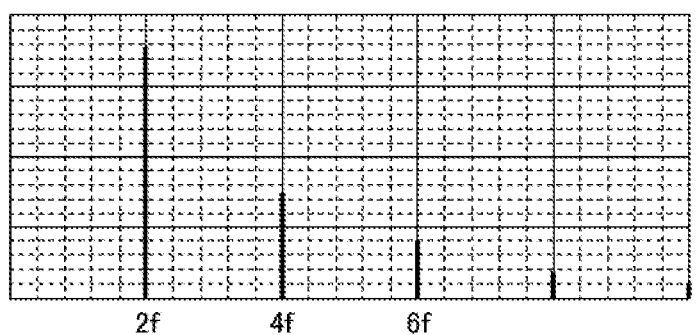

Next, a method of assessing voltage imbalance of an input power supply in the Example 1 will be described with reference to FIGS. 2A and 2B. FIGS. 2A and 2B show results of a DC voltage waveform at the smoothing capacitor 5 in FIG. 1 in a voltage balanced state or an unbalanced state and an amplitude spectrum obtained by performing Fourier transform on the DC voltage waveform. The results are obtained by a simulation operation of an input voltage corresponding to the three-phase AC power supply 2 in FIG. 1. Here, in each of FIGS. 2A(a), 2A(b), 2B(a), and 2B(b), the upper graph shows the DC voltage waveform (relative relation between the DC voltage on a vertical axis and the time on a horizontal axis), and the lower graph shows the amplitude spectrum (relative relation between the amplitude spectrum on a vertical axis and the frequency on a horizontal axis).

In the simulation, the reference voltage of the three-phase AC power supply is set to 200 V. FIG. 2A(a) shows a three-phase balanced state in which the voltages of three phases are respectively 200 V, 200 V, and 200 V. FIG. 2A(b) shows the case of a voltage unbalanced state in which the voltages of the three phases are respectively 200 V, 200 V, and 195 V. FIG. 2B(a) shows a voltage unbalanced state in which the voltages of the three phases are respectively 200 V, 200 V, and 185 V. FIG. 2B(b) shows a result of a phase loss in which a single phase has 200 V. The power supply frequency of the three-phase AC power supply is set to 50 Hz (the power supply frequency is described as f below).

Incidentally, the amplitude spectrum obtained by Fourier transform is used in the above description, but the invention is not limited to the amplitude spectrum. For example, a power spectrum in which a vertical axis corresponds to power may be used. A spectrum allowed to compare relative strength of the magnitude of the frequency component may be provided.

As shown in FIG. 2A(a), in a case where input voltages of three phases are balanced, a ripple component being six times f appears in the DC voltage waveform. To support this, an amplitude peak can be recognized at the frequency component being six times (6f component) f in the amplitude spectrum. This means the followings. The forward converter 4 in FIG. 1 rectifies the three-phase full wave, and thus a ripple voltage corresponding to positive and negative peaks of the three-phase AC voltage is applied to both ends of the smoothing capacitor 5. Charging and discharging are performed six times for each power supply cycle, by applying the ripple voltage.

On the contrary, for example, if the power supply voltage becomes unbalanced as in FIG. 2A(b), the ripple waveform of the DC voltage shown in FIG. 2A(a) begins to collapse. To reflect this, the amplitude peak begins to appear at components corresponding to two times (2f) and four times (4f) in the amplitude spectrum in addition to the amplitude peak at the 6f component present in the balanced state.

The 2f component and the 4f component significantly increase if the imbalance degree of the power supply increases more. In FIG. 2A(b) in which the imbalance degree is small, the magnitude relation in the amplitude spectrum satisfies "4f component<2f component<6f component". On the other hand, in FIG. 2B(a) in which the imbalance degree is large, the magnitude relation in the amplitude spectrum satisfies "6f component<4f component<2f component". That is, if both FIGS. 2A(b) and 2B(a) are compared to each other, it is understood that the magnitude of the 4f component exceeds the magnitude of the 6f component.

Regarding the phase loss state in FIG. 2B(b), the magnitude of the 6f component is reduced, and thus the magnitude relation of "6f component<4f component<2f component" is clearly shown. As described above, it is understood that the magnitude relation of the frequency component transitions in order of "4f component<2f component<6f component", "4f component<6f component<2f component", and "6f component<4f component<2f component", in a period from the balanced state to the phase loss through the unbalanced state.

In the transition, the meaningful difference as the unbalanced state appears at a point at which the magnitudes of the 4f and 6f components begin to reverse, and a change in the ripple of the DC voltage waveform appears in the vicinity of the point. For example, regarding the DC voltage waveform in FIG. 2B(a), in the balanced state, six peaks are present in one cycle (1/f) of the power supply. However, the DC voltage waveform is changed to a four-peak waveform. In the phase loss state in FIG. 2B(b), the DC voltage waveform becomes a two-peak waveform. This means a state where one phase (two phases in the case of the phase loss in FIG. 2B(b)) having the dropped voltage does not contribute to charging of the smoothing capacitor, and the power is supplied in discharging the smoothing capacitor.

That is, this means that a current does not flow into a specific diode in the forward converter 4 illustrated in FIG. 1. In this state, originally, the load concentrates on a specific diode due to compensating for charging power of an amount discharged in a section in which the smoothing capacitor is charged, by performing charging through a phase other than a phase in which no current flows.

As described above, a possibility that voltage imbalance at a level at which the load concentrates on the diode occurs is high in the vicinity of a point at which the 4f component exceeds the 6f component. Thus, it is proper and practical determination from a viewpoint of protecting the power conversion device 1, that the magnitude relation between the frequency components 4f and 6f in a DC voltage is compared, and thus, for example, the voltage unbalanced state is considered to be at a not-allowable level based on an assessment condition such as "6f component<4f component". The state in FIG. 2A(b) ideally corresponds to the voltage unbalanced state but the allowable voltage imbalance. If determination is performed only with the magnitudes of the 2f component and the 6f component, there is a high possibility that the state in FIG. 2A(b) is detected to be unbalanced.

As described above, while the degree of imbalance increases, the magnitude relation gradually transitions in order of "4f component<2f component<6f component", "4f component<6f component<2f component", and "6f component<4f component<2f component". Therefore, it is possible to assess which imbalance step the DC voltage reaches among such imbalance steps, by adding a relation with the 2f component to the comparison between the 6f component and the 4f component. For example, in a case where the imbalance state proceeds from the state in FIG. 2A(b), and reaches the voltage imbalance state before the state in FIG. 2B(a), this state is the allowable imbalance state. However, for example, in a case where it is desirable to know the imbalance tendency earlier, the three frequency components may be compared with each other, the result of the comparison may be presented to the higher device 12 as a voltage imbalance index such as an imbalance level, and thus it is possible to promote preventive maintenance at the early step. The magnitude of each frequency component changes depending on the magnitude of an output voltage of the three-phase AC power supply. Therefore, for example, in a case where, if the 2f component exceeds a certain level, the imbalance is determined, there is a problem that it is not possible to uniformly define the level for assessing the imbalance in a wide output voltage range with high accuracy. It is possible to avoid an occurrence of such a problem by comparing the magnitudes of a plurality of frequency components with each other.

Next, the practical assessment will be described based on the above-described voltage imbalance assessment method, with reference to the flowcharts in FIGS. 3 and 4. Incidentally, processing described below is performed by a microcomputer constituting the arithmetic operation device 10 in FIG. 1. Firstly, descriptions will be made with reference to the flowchart in FIG. 3. The arithmetic operation device 10 acquires a DC voltage of the smoothing capacitor 5, which is obtained through the voltage detection circuit 7 in FIG. 1, at a predetermined cycle and stores the acquired DC voltages as N pieces of time-series data (Step 100).

Then, the arithmetic operation device 10 generates data indicating frequency components, such as an amplitude spectrum, by performing Fourier transform on the N pieces of time-series data (Step 102). Incidentally, the cycle for detecting the DC voltage or the number N of pieces of data has an influence on the frequency resolution of the Fourier transform, but it is sufficient that the resolution in a range in which the spectrum for 2f, 4f, and 6f can be separated, that is, the resolution that is smaller than at least two times the power supply frequency can be realized.

The arithmetic operation device 10 compares the magnitudes of the components being four times (4f) and six times (6f) the power supply frequency with each other (Step 106). As a result obtained by the comparison, when the magnitude of the 4f component is greater than the magnitude of the 6f component (YES in Step 106), the voltage is assessed to be unbalanced, and the process proceeds to Step 108. When the magnitude of the 4f component is not greater than the magnitude of the 6f component (No in Step 106), the voltage is assessed to be balanced, and the process proceeds to Step 110. The comparison in Step 106 is not limited to the above-described simple magnitude comparison. For example, an optional correction term may be provided, and correction, for example, addition of the correction term to the magnitude of the 4f (or 6f) component or multiplication the correction term by the magnitude of the 4f (or 6f) component may be performed. Then, the magnitudes of the 4f component and the 6f component after the correction may be compared with each other (incidentally, in a case where one adjustment term is provided, it is similar to the above simple magnitude comparison). This has an advantage that it is possible to adjust the level of the imbalance assessment.

Further, the arithmetic operation device 10 performs a process (Step 108) performed in the unbalanced state and a process (Step 110) performed in the balanced state. For example, in Step 108, in order to shut off the output or output a warning, the drive circuit 9 is controlled to stop switching of the backward converter 6, or warning information is transmitted to the higher device 12. In Step 106, the arithmetic operation device 10 may further compare the 2f component with the 6f component. In this case, since the magnitude relation among the three components including the 4f component is assessed, it is also possible to assess the voltage imbalance index such as the level of the imbalance assessment. As an example of the process in Step 110, which is performed in the balanced state, the higher device 12 may be notified that the voltage is in the balanced state, or the comparison result in Step 106 may be stored in the storage device 11 with time.

The assessment may be not performed only by performing the flow in FIG. 3 once, but the balance or the imbalance may be assessed as the final result, for example, in a case where the arithmetic operation device 10 performs the flow in FIG. 3 three times, and the same result is obtained all times. It is possible to improve the accuracy of the assessment by integrating results obtained by performing the flow plural times. As described above, it is possible to assess the unbalanced state of the power supply voltage by performing the relative comparison between the specific frequency components (4f and 6f).

Next, descriptions will be made with reference to the flowchart in FIG. 4. The flow is used for performing the assessment with higher accuracy in a case where the power consumed in the load device 3 illustrated in FIG. 1 is small, and the ripple of the DC voltage in the smoothing capacitor 5 does not appear significantly, that is, in a case where the spectrum obtained by Fourier transform is small, and thus is hidden by the surrounding spectra. Incidentally, the same process in FIGS. 3 and 4 is denoted by the same reference sign. Here, the description of the same process will not be repeated, and only the step changed from FIG. 3 will be described below.

The arithmetic operation device 10 extracts the 4f component and the 6f component as comparison targets, from the data indicating the frequency components, which has been obtained in the previous step, and performs normalization by division by a 0f component being a DC component (Step 103). A determinable level is provided in advance in order to determine whether or not the 4f component and the 6f component are at a level at which the components can be used for determining the imbalance. The arithmetic operation device 10 assesses whether or not any of the normalized 4f component and 6f component is equal to or greater than the determinable level (Step 104). In a case where the 4f component and the 6f component are equal to or greater than the determinable level (YES in Step 104), the arithmetic operation device assesses that the assessment of the imbalance is possible, and the process proceeds to Step 106. In a case where the 4f component and the 6f component are smaller than the determinable level (No in Step 104), the arithmetic operation device assesses that the assessment of the imbalance is not possible, and the process proceeds to Step 112. In a case where the assessment is possible, and thus the process proceeds to Step 106, it may be assessed whether the voltage is balanced or unbalanced, in a manner that the magnitudes of components (4f and 6f) being four times and six times the power supply frequency are not compared as described with reference to FIG. 3, but the magnitude of the normalized 4f component and the magnitude of the normalized 6f component are compared with each other.

The fluctuation ratio to the DC component is obtained by normalization with the 0f component. Therefore, even though the entire voltage level of the three-phase power supply voltage changes, assessment of whether the ripple as large as the spectrum of the significant level is obtained occurs in the DC voltage waveform is easily performed. Incidentally, as an example of the case of normalizing the 6f component in FIG. 2A(a), the 6f component/the 0f component=5 V/275 V=about 1.8%. The determinable level in Step 103 may be set to be adjustable depending on the situation, for example, may be set to ⅕ of this level.

Incidentally, Step 112 is a process performed in a case where assessment is not possible, and various processes as described in Step 108 are considered. The assessment accuracy may be improved by integrating results obtained by performing the flow illustrated in FIG. 4 plural times. Since the processes of Step 103 and Step 104 are performed, it is possible to exclude a situation in which erroneous assessment is performed, for example, in a case where the 4f component or the 6f component is affected by noise. In addition, even when the power consumption is small, it is possible to assess the imbalance with high accuracy.

Example 2

Next, Example 2 will be described. FIG. 5 illustrates a block diagram of a power conversion device 1 in Example 2. Example 2 is a method of assessing voltage imbalance of an input power supply even in a case where the power conversion device 1 is stopped, that is, even when power is not consumed in the load device 3.

Compared to FIG. 1 in Example 1, a configuration in which a resistive load 13 and a switch 14 are connected in series and a switch driving circuit 15 that drives the switch 14 are added in FIG. 5. Incidentally, other components are the same as those in FIG. 1, and are denoted by the same reference signs. These components are the same as those in Example 1, and thus the description will not be repeated.

The resistive load 13 and the switch 14 connected in series are connected to the smoothing capacitor 5 in parallel. Further, the switch driving circuit 15 that turns the switch ON and OFF is connected to the switch 14. The switch driving circuit 15 is connected to the control circuit 8, and the control circuit 8 controls ON and OFF of the switch 14 with the switch driving circuit 15.

Incidentally, specific examples of constituent components of the resistive load 13, the switch 14, and the switch driving circuit 15 include a braking resistor and a regenerative braking unit installed for the purpose of consuming regenerative power from the load device 3. However, Example 2 is not limited thereto, and any configuration can be applied so long as the configuration can actively consume power accumulated in the smoothing capacitor.

If the switch 14 in the configuration in FIG. 5 is caused to turn ON, during the ON time, a DC voltage between both ends of the smoothing capacitor 5 is applied to the resistive load 13, and power is supplied to the resistive load 13 by discharging the smoothing capacitor. At this time, the power supplied to the resistive load 13 is consumed as heat. Incidentally, the description is made on the assumption that the power conversion device 1 is set to be stopped, and power conversion for powering or regeneration with the load device 3 through the backward converter 6 is not performed. It is assumed that the switch 14 can be driven independently from the operation or stop of the power conversion device 1.

As described above, a state where the resistive load 13 consumes power is basically the same as a state where the load device 3 in Example 1 consumes power, in the meaning that power is not supplied from the input power supply. Even in Example 2, the ripple corresponding to the power supply frequency occurs in the DC voltage. Thus, even in a Fourier spectrum obtained in Example 2, the tendency that appears by the influence of the power supply imbalance (change appears in the magnitude relation among the 2f component, the 4f component, and the 6f component) as described in Example 1 is the same. It is possible to assess the voltage imbalance by the same method as the flowcharts in FIGS. 4 and 5.

With the above description, in Example 2, even when the power conversion device 1 is stopped, that is, even in a state where power is not supplied to the load device 3, it is possible to assess the voltage imbalance. Incidentally, the present invention is not limited to the above-described examples, and various modifications may be provided.

REFERENCE SIGNS LIST

1 Power conversion device
2 Three-phase AC power supply
3 Load device
4 Forward converter
5 Smoothing capacitor
6 Backward converter
7 Voltage detection circuit
8 Control circuit
9 Drive circuit
10 Arithmetic operation device
12 Higher device
13 Resistive load
15 Switch driving circuit

The invention claimed is:

1. A voltage imbalance assessment method in a power conversion device including a forward converter that rectifies a voltage of a three-phase AC power supply, a smoothing capacitor that smooths the rectified voltage, a detection unit that detects the smoothed voltage, and a control unit,
wherein the control unit
generates data indicating frequency components based on the detected voltage,
compares a magnitude of a component being four times a power supply frequency with a magnitude of a component being six times the power supply frequency in the data indicating the frequency component, and
assesses voltage imbalance of the three-phase AC power supply based on the comparison,
wherein the magnitudes of the components being the four times and the six times the power supply frequency among power supply frequency components in the data indicating the frequency component are normalized by division by a magnitude of a component being zero times the power supply frequency which is a DC component,
in a case where values obtained by the normalization are equal to or greater than a determinable level, the voltage imbalance of the three-phase AC power supply is assessed, and in a case where the values are smaller than the determinable level, assessment of the voltage imbalance of the three-phase AC power supply is set not to be possible.

2. The voltage imbalance assessment method according to claim 1,
wherein, in a case where the magnitude of the component being the four times the power supply frequency is greater than the magnitude of the component being the six times the power supply frequency, the three-phase AC power supply is assessed to be voltage-unbalanced.

3. The voltage imbalance assessment method according to claim 2,
wherein an amplitude spectrum indicating the frequency component is generated by performing Fourier transform on time-series data of the detected voltage.

4. The voltage imbalance assessment method according to claim 1,
wherein the voltage imbalance of the three-phase AC power supply is assessed by correcting the magnitude of the component being the four times the power supply frequency and the magnitude of the component being the six times the power supply frequency, and comparing the corrected magnitude of the component being the four times the power supply frequency with the corrected magnitude of the component being the six times the power supply frequency.

5. The voltage imbalance assessment method according to claim 1,
wherein the voltage imbalance of the three-phase AC power supply is assessed by comparing the magnitudes of three frequency components which further include a component being two times the power supply frequency in the data indicating the frequency components.

6. A power conversion device comprising:
a forward converter that rectifies a voltage from a three-phase AC power supply;
a smoothing capacitor that smooths the rectified voltage;
a voltage detection unit that detects a voltage of the smoothing capacitor; and
an arithmetic operation unit that is connected to the voltage detection unit,
wherein the arithmetic operation unit
acquires time-series data of the voltage detected by the voltage detection unit,
generates data indicating frequency components based on the acquired time-series data,
compares a magnitude of a component being four times a power supply frequency with a magnitude of a component being six times the power supply frequency in the data indicating the frequency components, and
assesses voltage imbalance of the three-phase AC power supply based on the comparison,
wherein the magnitudes of the components being the four times and the six times the power supply frequency among power supply frequency components in the data indicating the frequency component are normalized by division by a magnitude of a component being zero times the power supply frequency which is a DC component,
in a case where values obtained by the normalization are equal to or greater than a determinable level, the voltage imbalance of the three-phase AC power supply is assessed, and
in a case where the values are smaller than the determinable level, assessment of the voltage imbalance of the three-phase AC power supply is set not to be possible.

7. The power conversion device according to claim 6,
wherein the smoothing capacitor is connected to a backward converter that performs conversion into an AC voltage, and
the backward converter is connected to a load device.

8. The power conversion device according to claim 7, further comprising:
an element that is provided in parallel with the smoothing capacitor and consumes power of the smoothing capacitor in a case where the load device does not consume the power; and
a driving unit that controls power consumption in the element.

9. The power conversion device according to claim 7,
wherein, in a case where the three-phase AC power supply is assessed to be voltage-unbalanced, the arithmetic operation unit controls a drive circuit of the backward converter to stop switching of the backward converter.

10. The power conversion device according to claim 6, wherein the arithmetic operation unit generates an amplitude spectrum including the frequency components by performing Fourier transform on the time-series data.

11. The power conversion device according to claim 6, wherein a higher device is connected to the power conversion device, and in a case where the arithmetic operation unit assesses that the three-phase AC power supply is assessed to be voltage-unbalanced, the arithmetic operation unit transmits warning information to the higher device.

\* \* \* \* \*